Figure 1:
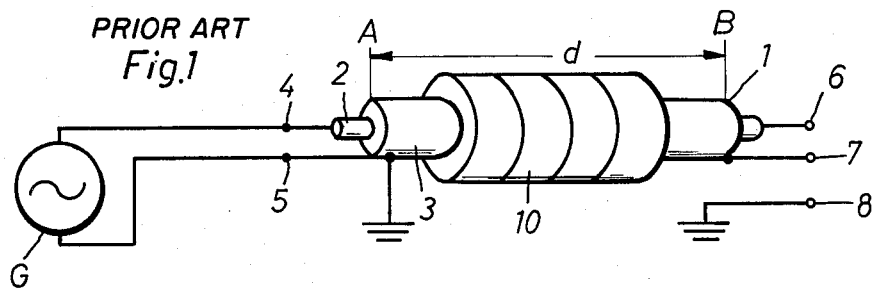

United States Patent [19]

Stock et al.

[11] 4,222,016

[45] Sep. 9, 1980

[54] HIGH FREQUENCY TRANSFORMER

[75] Inventors: Don J. R. Stock, Schopfheim-Langenau; Wilfried Sartorius, Steinen, both of Fed. Rep. of Germany

[73] Assignee: Endress u. Hauser GmbH u. Co., Maulburg, Fed. Rep. of Germany

[21] Appl. No.: 943,974

[22] Filed: Sep. 20, 1978

[30] Foreign Application Priority Data

Oct. 5, 1977 [DE] Fed. Rep. of Germany ....... 2744863

[51] Int. Cl.² ............................ H01P 5/02; H01P 5/08
[52] U.S. Cl. .................................... 333/24 R; 333/33; 333/35; 333/245; 336/175; 336/195
[58] Field of Search ................. 328/65; 333/20, 24 R, 333/25, 26, 32, 33, 35, 245, 27; 336/175, 195, 221

[56] References Cited

U.S. PATENT DOCUMENTS 3,370,257  2/1968  Spierling ................................ 333/33
3,428,886  2/1969  Kawashima et al. .................. 333/33
3,614,676  10/1971  Boelke ................................ 333/35 X Primary Examiner—Paul L. Gensler
Attorney, Agent, or Firm—Gerald J. Ferguson, Jr.; Joseph J. Baker

[57] ABSTRACT

High frequency transformer built from coaxial conductor sections, wherein a pair of coaxial conductor sections of equal length have external conductors which are insulated from each other. The input end of the external conductor of the first coaxial conductor section is connected with the input end of the internal conductor of the second coaxial conductor section and both of the unconnected input end internal and external conductors form input connections. The output end of the internal conductor of the first coaxial conductor section is connected with the output end of the external conductor of the second coaxial conductor section and both of the unconnected output end internal and external conductors form output connections.

12 Claims, 9 Drawing Figures

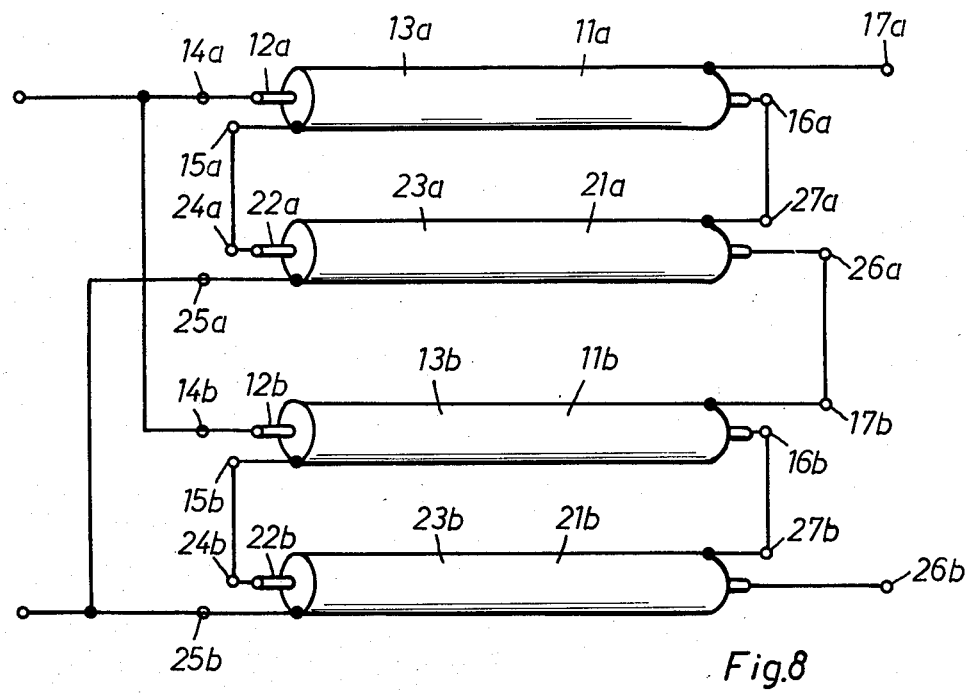
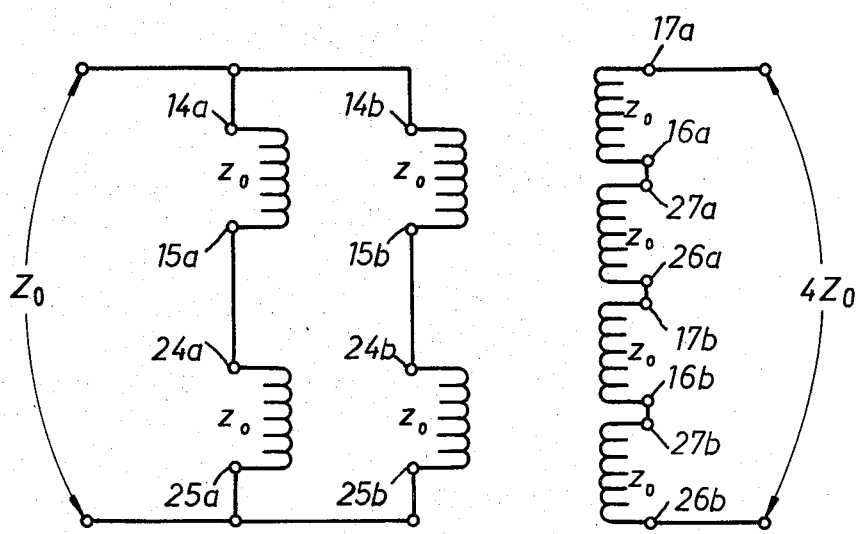

HIGH FREQUENCY TRANSFORMER

The invention concerns a high frequency transformer formed from coaxial conductor sections.

A high frequency transformer is known which is formed from a coaxial conductor section, whose length has an order of magnitude of one quarter of the operating wavelength. If in such a transformer the input connections on the internal conductor and on the external conductor are connected with a high frequency signal source and, in addition, the input connection of the external conductor is connected to earth, then the output connection of the external conductor will assume a potential which is different from the earth's potential. By this means there are obtained on the output end between the earth connection and each of the two connections on the internal conductor and on the external conductor two output signals with opposite phases at half of the impedance of the coaxial cable. Such a transformer can hence be used as an impedance converter with the transmission ratio 2:1 and also as a balancing element.

The inductance of the external conductor of the coaxial conductor section forms, together with the capacitance against the earth, a low pass filter element which isolates the output from the input at high frequencies. This isolation is incomplete at lower frequencies which can cause distortion in the transmission of high frequency pulses, which have a large proportion of components with lower frequencies. It is known that such distortions can be avoided by attaching a ferrite envelope on the external conductor of the coaxial conductor section, which, for example, consists of ferrite ring cores, which are pushed on to the outside conductor. This increases the inductance of the external conductor and the limiting frequency of the low pass filter element is reduced.

For the direct current, however, a direct galvanic connection always exists between the input connections and the output connections, on the one hand via the internal conductor, and on the other hand via the external conductor of the coaxial conductor section.

There are, however, cases of application in which a galvanic isolation is required in a high frequency transmission conductor. This is the case, for example, with transmission of measured value signals, if the measured value transducer is situated in an explosion hazard area and the analysis instruments are situated outside the explosion hazard area. In this case the current circuits carrying the signal pulses must be inherently safe, i.e. the electrical energy in these conductors must be so low that sparks, electric arcs and temperatures capable of igniting cannot be generated.

In the low frequency region this inherent safety can be achieved by isolating the current circuits by conventional transformers from each other by galvanic means. Such transformers, however, are not suitable for transmission of pulses of very high frequency; at frequencies in the Giga Hertz region the wire lengths used are already of the order of magnitude of the wavelength.

Coaxial conductor transformers of the type described above are suitable for transmission of high frequency pulses; however, they do not ensure the required galvanic isolation.

The objective of the invention is the creation of a high frequency transformer which is suitable for transmission of signals of very high frequency with great bandwidth and which ensures complete galvanic isolation between the input and output.

This problem is solved according to the invention by providing a pair of coaxial conductor sections of equal length, whose external conductors are isolated from each other. On the input end the external conductor of the first coaxial conductor section is connected with the internal conductor of the second coaxial conductor section and the two not connected conductors form the input connections and on the output end the internal conductor of the first coaxial conductor section is connected with the external conductor of the second coaxial conductor section and the two connectors not connected form the output connections.

The transformer according to the invention ensures transmission of high frequency signals over a wide frequency band. Owing to the specified connection of two coaxial sections no direct-conducting connection exists between the input and the output connections. The transformer is fully reversible; the input and output can be exchanged.

In order to avoid distortions in the transmission of pulses, which contain low frequency components, a ferrite envelope is attached preferably on the external conductor of each coaxial conductor section.

If the transformer is built up of two coaxial conductor sections in the above specified manner, then it has the same impedance on input and output, which impedance has double the value of the wave resistance of each of the two coaxial conductor sections. Hence the transformer transmission ratio is 1:1. It can be used in this case for galvanic isolation of two systems with equal impedance, in which the wave resistance of each coaxial conductor section is to be selected to be equal to half of the system impedance.

However, it is also possible to build transformers according to the above specified principle with a transmission ratio different from 1:1. For example a transformer with the impedance transformation ratio of 1:4 is obtained by providing two pairs of coaxial conductor sections; both pairs are parallel connected on one end at their free connections and both pairs are connected in series at the other end.

Further features and advantages of the invention are described by means of an embodiment example and drawings. The drawings show as follows:

FIG. 1—a high frequency transformer of known kind, formed from a coaxial conductor section, for better understanding of the principle of the invention.

Figure 2:
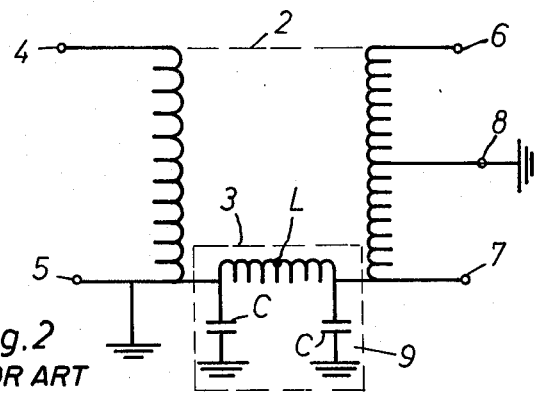

FIG. 2—The diagram of the transformer of FIG. 1.

Figure 3:
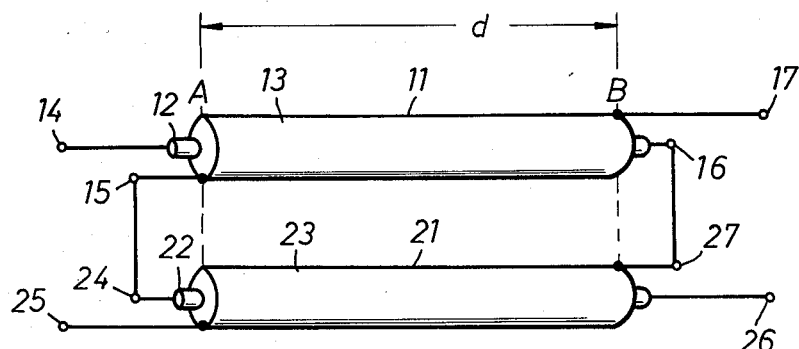

FIG. 3—The basic layout of a high frequency transformer according to the invention.

Figure 4:
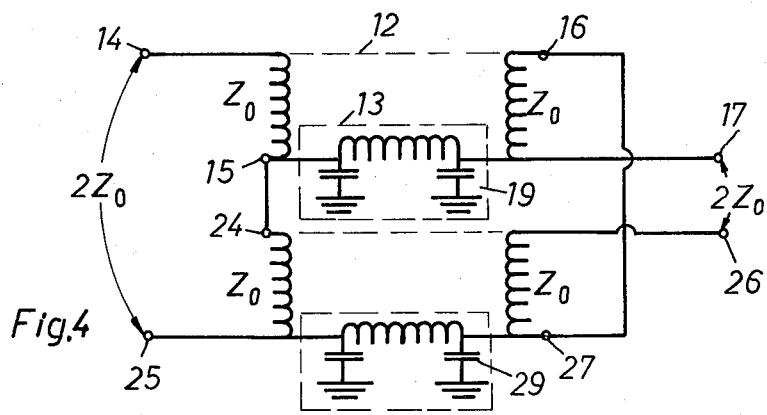

FIG. 4—The layout diagram of the transformer in FIG. 3.

Figure 5:
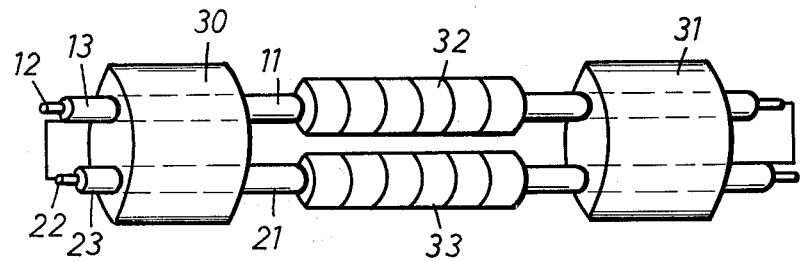

FIG. 5—a practical embodiment of the transformer of FIG. 3.

Figure 6:
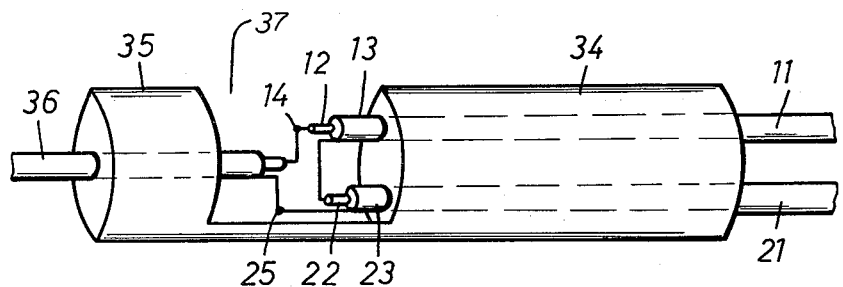

FIG. 6—a modified embodiment of one part of the transformer of FIG. 5.

Figure 7:
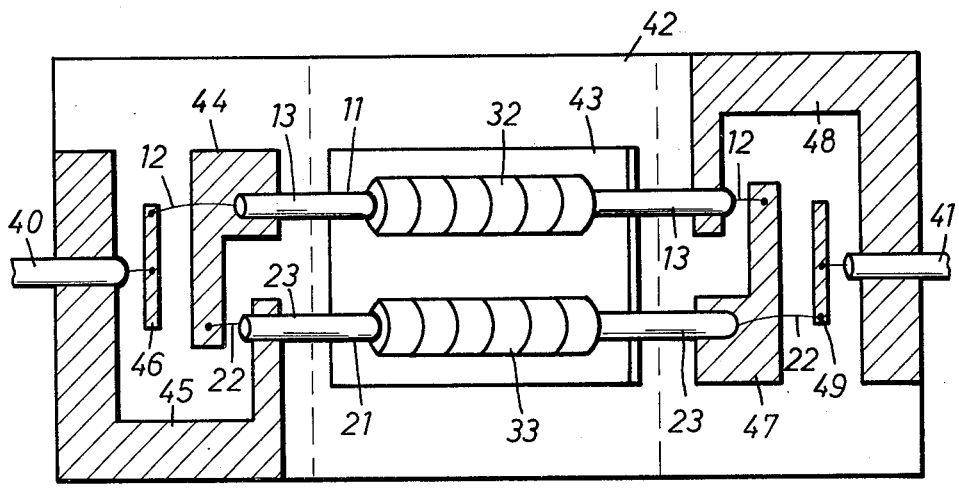

FIG. 7—another practical embodiment of the transformer in FIG. 3.

FIG. 8—the basic layout of a high frequency transformer according to the invention with a different transmission ratio and FIG. 9—a simplified diagram of the transformer of FIG. 8.

FIG. 1 shows a transformer of a known kind, which is formed from a coaxial conductor section 1 of the length d which consists of an internal conductor 2 and an external conductor 3. On the input end A the connection 4 of the internal conductor 2 and the connection 5 of the external conductor 3 are connected with the two connections of a generator G. The connection 5 is at earth's potential.

The connection 7 of the external conductor 3 on the output end B is also at earth's potential for direct current and for very low frequencies. At high frequencies, for which the length d is of the order of magnitude of a quarter of the operating wavelength, however, the connection 7 has a potential which is different from the potential at the earthing connection 8. The diagram shown in FIG. 2 is applicable to the transformer at these high frequencies.

Between the connections 4 and 5 there is an impedance $Z_o$ on the input end A, which corresponds to the wave resistance of the coaxial conductor. The same impedance $Z_o$ exists on the output end between the connections 6 and 7. However, between the earth connection 8 and each of the connections 6 and 7 exists the impedance $Z_o/2$. Hence it is possible to connect between the connections 6 and 8 a conductor or a load with the impedance $Z_o/2$; in this case the transformer produces an impedance transformation in the ratio 2:1. It is further possible to connect to the connections 6 and 7 two conductors symmetrical against the earth, so that the transformer acts as a balancing element.

The $\pi$ element 9, shown in a rectangle drawn with broken lines, with its direct axis inductance L and two capacitances C in the quadrature axis represents the impedance of the external conductor 3 relative to earth. The $\pi$ element is a low pass filter, which isolates the connections 5 and 7 from each other at high frequency. This isolation, however, is incomplete at lower frequencies and it can be seen directly that a galvanic short circuiting connection exists between the terminals 5 and 7 for direct current. In a similar manner there exists for direct current a galvanic short circuiting connection by the internal conductors 2 between the connections 4 and 6.

Since the inductance L of the external conductor 3 is in general very low and the limiting frequency of the low pass filter element 9 is accordingly very high, distortions can therefore occur on transmission of pulses which have a large proportion of low frequency components. It is known that the inductance L can be increased by enclosing the external conductor 3 over part of its length with an envelope made of high permeability material, for example ferrite ring cores 10 (FIG. 1) which are pushed over the external conductor 3. The galvanic direct current connection still remains, however, also on using this precaution.

As described below, the properties of the previously described transformer consisting of a coaxial conductor section are utilized for forming a transformer which is suitable for transmission of high frequency pulses, in which however, additionally the input end is galvanically isolated from the output end.

An embodiment of this transformer is shown in FIG. 3. It consists of two parallel coaxial conductor sections 11 and 21 of length d.

The coaxial conductor section 11 has the internal conductor 12 and external conductor 13; the coaxial conductor section 21 has the internal conductor 22 and external conductor 23.

On the input end A the connection 15 of the external conductor 13 of the coaxial conductor section 11 is connected with the connection 24 of the internal conductor 22 of the coaxial conductor section 21. The input connections of the transformer are formed by the connection 14 of the internal conductor 12 of the coaxial conductor section 11 and by the connection 25 of the external conductor 23 of the coaxial conductor section 21.

On the output end B the connection 16 of the internal conductor 12 of the coaxial conductor section 11 is connected with the connection 27 of the external conductor 23 of the coaxial conductor section 21. The output connections of the transformer are formed by the connection 17 of the external conductor 13 of the coaxial conductor section 11 and by the connection 16 of the internal conductor 22 of the coaxial conductor section 21.

The diagram of the transformer in FIG. 3 is shown in FIG. 4. The low pass filter elements 19 and 29 represent once again the impedance of the external conductors 13 or 23 against earth.

On tracing in FIGS. 3 and 4 the direct current path via the internal conductors 12,22 and via external conductors 13, 23 then it is seen that no galvanic connection exists between the input connections 14, 25 on the one hand and the output connections 17, 26 on the other hand. However, these connections are coupled to each other where high frequencies are concerned.

Between the input connections 14 and 25 the impedances $Z_o$ of the two coaxial conductor sections are connected in series; the transformer has hence the input impedance $2Z_o$. In a similar manner the two impedances $Z_o$ are connected in series between the output connections 17 and 26, so that the transformer has the output impedance $2Z_o$. Hence the transformer shown in FIG. 3 has the transmission ratio 1:1.

In order to avoid distortions in the transmission of pulses with low frequency components it is also possible to use the precaution in the transformer of FIG. 3 of introducing the inductance L on the external conductor of each coaxial conductor section 11 and 21 by attaching an envelope of ferrite ring cores; the described galvanic isolation between the input end and output end is not influenced by this measure.

The transformer is fully reversible and can be operated in both directions; i.e. input and output can be exchanged.

The length d of the two coaxial conductor sections is equal to one quarter of the medium wavelength $\lambda$ of the high frequency waves transmitted by the transformer or equal to a multiple or a fraction of the quarter wave length. The lengths d of $\lambda/4$ and $\lambda/8$ have been found useful in practice.

Attention must be paid that the external conductors 13 and 23 of both coaxial conductor sections 11,21 can each have widely different potentials, applied at the input and output ends. For this reason the external conductors must be isolated from each other and also against the earth. The isolation or the distance between two external conductors must be dimensioned according to the valid safety regulations so that flashover is avoided.

FIG. 5 shows a practical embodiment of the transformer of FIG. 3. Both coaxial conductor sections 11 and 21 are held at both ends at the required distance from each other in dielectric end pieces 30,31.

Ferrite core rings 32 or 33 are attached on the coaxial conductor section parts situated between the end pieces. In order to ensure that the required spacing is maintained also in this area coaxial conductors are used, whose outside conductor consists of a solid metal tube. Such coaxial conductors are available commercially under the designation "semi rigid" and they have the necessary stiffness.

If the transformer is to be used for galvanic isolation between two coaxial cables, then each of the two end pieces can be formed in the manner shown in FIG. 6. The end piece 34 shown has an integral extension 35, which is used as a holder for the end of the input coaxial cable 36. In the slot 37 between the end piece 34 and the extension 35 can be established the connection of the internal conductor of the coaxial cable 36 with the connection 14 and the connection of the external conductor of the coaxial cable with the connection 25. The end piece not shown on the output end is formed in a corresponding manner.

If the coaxial cable 36 has a wave resistance of 50 ohms, then it is obviously necessary to use a coaxial conductor with wave resistance 25 ohms for the coaxial conductor sections 11, 21.

FIG. 7 shows another practical embodiment of the transformer of FIG. 3 for the insertion between two coaxial cables 40, 41. Both coaxial conductor sections 11, 21 are mounted on an insulating plate 42, which has opening 43 for accommodating ferrite ring cores 32, 33. The sections of the insulating plate 42 situated on both sides of the opening 43 are provided with printed cnductors used for establishing the circuit connections.

On the input end the external conductor 13 of the coaxial conductor section 11 is soldered on a conductor 44, on which is also soldered the internal conductor 22 of the coaxial conductor section 21. The external conductor 23 of the coaxial conductor section 21 is soldered on a conductor 45, on which is soldered also the external conductor of the coaxial cable 40. A conductor 46 is used for connection between the internal conductor 12 of the coaxial conductor section 11 and the internal conductor of the coaxial cable 40.

The external conductor 23 of the coaxial conductor section 21 is soldered on a conductor 47 on the output end, on which is also soldered the internal conductor 12 of the coaxial conductor section 11. The external conductor 13 of the coaxial conductor section 11 is soldered on a conductor 48, on which is also soldered the external conductor of the coaxial cable 41. A conductor 49 is used for connection between the internal conductor 22 of the coaxial conductor section 21 and the internal conductor of the coaxial cable 41.

The rear face of the insulating plate 42 which is not visible in FIG. 7 is provided with a metal coating, which is used also as an earthing plane. This earthing plane forms with the printed conductors on the other side conductors according to the principle of the micro band conductors.

According to the principle described above, transformers which have different transmissions ratio than 1:1 can also be formed. As an example, FIG. 8 shows a transformer, which is formed by the connection of two transformers of the type shown in FIG. 3 and which yields an impedance transformation of 1:4 in which once again fully galvanic isolation exists between the input and output.

For better understanding the same reference designations as in FIG. 3 are used in FIG. 8 for the components of both transformer systems, to which are also added, for one transformer system, the letter a and for the other transformer system the letter b. Both coaxial conductor sections 11a, 21a or 11b, 21b of both transformer systems are connected together in the same manner as the coaxial conductor sections 11, 21 of the transformer in FIG. 3.

The connections 14a and 14b, on the one hand and the connections 25a and 25b on the other hand are connected to each other on the input end, so that the inputs of both transformer systems are connected in parallel.

On the output end the connection 26a of one transformer system is connected with the connection 17b of the other transformer system, by means of which the outputs of both transformer systems between the connections 17a and 26b are connected in series.

FIG. 9 shows a greatly simplified diagram of the transformer of FIG. 8 in which the low pass filter element representing the impedance of the external conductor is omitted for better viewing.

As shown in FIG. 9 directly, there exists between the two input connections the impedance $Z_o$ and between the two output end connections exists the impedance $4Z_o$. Hence the transformer can be used, for example, as an impedance converter between a 50 ohm coaxial cable and a 200 ohm double conductor, in which it ensures full galvanic isolation between the two conductors.

Obviously the transformer in FIG. 8 is also fully reversible, so that the input and output can be exchanged.

As in the embodiment examples described above, it is possible to attach ferrite ring cores on the external conductor of each coaxial conductor section also in the transformers of FIG. 8.

We claim:

1. High frequency transformer built from coaxial conductor sections, wherein a pair of coaxial conductor sections of equal length have external conductors which are insulated from each other, the input end of the external conductor of the first coaxial conductor section is connected with the input end of the internal conductor of the second coaxial conductor section and both of the unconnected input end internal and external conductors form input connections, and wherein the output end of the internal conductor of the first coaxial conductor section is connected with the output end of the external conductor of the second coaxial conductor section and both of the unconnected output end internal and external conductors form output connections.

2. High frequency transformer according to claim 1, wherein both coaxial conductor sections are arranged parallel to each other with a separating distance.

3. High frequency transformer according to claim 1 or 2, wherein a ferrite envelope is placed on the external conductor of each coaxial conductor section.

4. High frequency transformer according to claim 1 wherein the length of each coaxial conductor section is equal to one quarter of the operating wavelength or a multiple of the said operating wavelengths.

5. High frequency transformer according to claim 1 wherein the length of each coaxial conductor section is equal to one eighth of the operating wavelength.

6. High frequency transformer according to claim 1 wherein the external conductor of each coaxial conductor section is a solid metal envelope.

7. High frequency transformer according to claim 1, 4, 5 or 6 wherein the internal conductor of an input coaxial cable is connected with the internal conductor of the first coaxial conductor section and its external conductor is connected with the external conductor of the second coaxial conductor section, the internal conductor of an output coaxial cable is connected to the internal conductor of the second coaxial conductor section and the external conductor is connected to the external conductor of the first coaxial conductor section and the wave resistance of the input and output coaxial cables is double the wave resistance of each coaxial conducting section.

8. High frequency transformer according to claim 1 wherein two pairs of coaxial conducting sections are provided, both pairs are on one end parallel connected by their free connections and both pairs are series connected on the other end.

9. High frequency transformer according to claim 1 wherein the ends of the coaxial conductor sections are fastened on the input end and on the output end to a dielectric end piece.

10. High frequency transformer according to claim 1 or 2 wherein the coaxial conductor sections are attached to insulating plates with printed conductors and their external and internal conductors are connected to each other by means of printed conductors or with an external circuit.

11. High frequency transformer according to claim 10 wherein the insulating plate has a cut out section in which those parts of the coaxial conductor sections which carry ferrite envelopes are accommodated.

12. High frequency transformer according to claim 10 wherein the rear end of the insulating plate has a metallic coating used as earthing plane.

* * * * *